United States Patent
Wang et al.

(10) Patent No.: US 9,859,128 B2
(45) Date of Patent: Jan. 2, 2018

(54) SELF-ALIGNED SHIELDING OF SILICON OXIDE

(71) Applicant: APPLIED MATERIALS, INC., Santa Clara, CA (US)

(72) Inventors: Fei Wang, Fremont, CA (US); Mikhail Korolik, San Jose, CA (US); Nitin K. Ingle, San Jose, CA (US); Anchuan Wang, San Jose, CA (US); Robert Jan Visser, Menlo Park, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/337,781

(22) Filed: Oct. 28, 2016

(65) Prior Publication Data

US 2017/0148642 A1 May 25, 2017

Related U.S. Application Data

(63) Continuation-in-part of application No. 15/235,048, filed on Aug. 11, 2016.
(Continued)

(51) Int. Cl.
| H01L 21/311 | (2006.01) |
| H01L 21/461 | (2006.01) |
| H01L 21/02  | (2006.01) |

(52) U.S. Cl.
CPC .. *H01L 21/31144* (2013.01); *H01L 21/02164* (2013.01); *H01L 21/02211* (2013.01); *H01L 21/02271* (2013.01); *H01L 21/31116* (2013.01)

(58) Field of Classification Search
CPC ............ H01L 21/311; H01L 21/31111; H01L 21/32134; H01L 51/0017; H01L 51/56
(Continued)

(56) References Cited

U.S. PATENT DOCUMENTS

| 6,146,767 A  | 11/2000 | Schwartz et al. |
| 7,718,011 B2 | 5/2010  | Fishkin et al.  |

(Continued)

FOREIGN PATENT DOCUMENTS

| KR | 100841170 B1  | 6/2008 |
| WO | 2017087138 A1 | 5/2017 |

OTHER PUBLICATIONS

PCT/US2016/059493, "International Search Report and Written Opinion", dated Jan. 31, 2017, 12 pages.
(Continued)

*Primary Examiner* — Hsien Ming Lee
(74) *Attorney, Agent, or Firm* — Kilpatrick Townsend & Stockton LLP

(57) ABSTRACT

Methods of etching silicon nitride faster than silicon or silicon oxide are described. Methods of selectively depositing additional material onto the silicon nitride are also described. Exposed portions of silicon nitride and silicon oxide may both be present on a patterned substrate. A self-assembled monolayer (SAM) is selectively deposited over the silicon oxide but not on the exposed silicon nitride. Molecules of the self-assembled monolayer include a head moiety and a tail moiety, the head moiety forming a bond with the OH group on the exposed silicon oxide portion and the tail moiety extending away from the patterned substrate. A subsequent exposure to an etchant or a deposition precursor may then be used to selectively remove silicon nitride or to selectively deposit additional material on the silicon nitride.

14 Claims, 8 Drawing Sheets

Related U.S. Application Data

(60) Provisional application No. 62/258,122, filed on Nov. 20, 2015.

(58) Field of Classification Search
USPC .............. 438/694, 743–745, 756, 757, 791
See application file for complete search history.

(56) References Cited

U.S. PATENT DOCUMENTS

| | | |
|---|---|---|
| 2005/0186339 A1 | 8/2005 | Rajagopalan et al. |
| 2008/0146011 A1 | 6/2008 | Yoon et al. |
| 2009/0047790 A1 | 2/2009 | Raghu et al. |
| 2010/0300221 A1 | 12/2010 | Lee et al. |
| 2011/0163062 A1 | 7/2011 | Gordon et al. |
| 2012/0074575 A1 | 3/2012 | Yeom et al. |
| 2012/0088315 A1 | 4/2012 | Merelle et al. |
| 2013/0065400 A1* | 3/2013 | Yoshimizu ........ H01L 21/31144 438/757 |
| 2013/0316541 A1 | 11/2013 | Benwadih et al. |
| 2014/0262461 A1 | 9/2014 | Trainor et al. |
| 2015/0294863 A1 | 10/2015 | Nemani et al. |
| 2015/0318297 A1 | 11/2015 | Hada |
| 2017/0148640 A1 | 5/2017 | Wang et al. |

OTHER PUBLICATIONS

Taflin, et al., "Electrified droplet fission and the Rayleigh limit", Langmuir, Department of Chemical Engineering, BF-IO, University of Washington, vol. 5, No. 2, 1989, pp. 376-384.

* cited by examiner

SELF-ALIGNED SHIELDING OF SILICON OXIDE

CROSS-REFERENCES TO RELATED APPLICATIONS

This application is a continuation-in-part of U.S. patent application Ser. No. 15/235,048, filed Aug. 11, 2016; which claims the benefit of U.S. Provisional Patent Application No. 62/258,122 filed Nov. 20, 2015. The disclosures of Ser. No. 15/235,048 and 62/258,122 are hereby incorporated by reference in their entirety for all purposes.

FIELD

Embodiments described herein relate to selectively shielding silicon oxide from etching and deposition.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which removes one material faster than another helping e.g. a pattern transfer process proceed. Such an etch process is said to be selective to the first material. As a result of the diversity of materials, circuits and processes, etch processes have been developed with a selectivity towards a variety of materials. However, there are a dearth of options for selectively removing silicon nitride faster than silicon or silicon oxide.

Dry etch processes are often desirable for selectively removing material from semiconductor substrates. The desirability stems from the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors. For example, remote plasma excitation of ammonia and nitrogen trifluoride enables silicon oxide to be selectively removed from a patterned substrate when the plasma effluents are flowed into the substrate processing region. Remote plasma etch processes have also been developed to remove silicon nitride, however, the silicon nitride selectivity of these etch processes (relative to silicon or silicon oxide) can still benefit from further improvements.

Methods are needed to improve silicon nitride etch selectivity relative to silicon or silicon oxide for dry etch processes.

SUMMARY

Methods of etching silicon nitride faster than silicon oxide are described. Methods of selectively depositing additional material onto the silicon nitride are also described. Exposed portions of silicon nitride and silicon oxide may both be present on a patterned substrate. A self-assembled monolayer (SAM) is selectively deposited over the silicon oxide but not on the exposed silicon nitride. Molecules of the self-assembled monolayer include a head moiety and a tail moiety, the head moiety forming a bond with the OH group on the exposed silicon oxide portion and the tail moiety extending away from the patterned substrate. A subsequent gas-phase etch using anhydrous vapor-phase HF may then be used to selectively remove silicon nitride much faster than silicon oxide because the SAM has been found to delay the etch and reduce the etch rate. A subsequent deposition may analogously be used to selectively deposit additional material on the silicon nitride much faster than on the silicon oxide due to the presence of the SAM.

Methods are described herein which include removing silicon nitride from a patterned substrate. The methods include (i) selectively forming a partial layer over silicon oxide portions of the patterned substrate but not over silicon nitride portions of the patterned substrate. The partial layer is patterned after formation without applying any form of lithography. The methods further include (ii) selectively etching the silicon nitride from the silicon nitride portions faster than silicon oxide from the silicon oxide portions.

The patterned layer may be patterned after formation without applying any intervening lithography or etching operations. Operation (i) may occur before operation (ii). Operations (i) and (ii) may be repeated an integral number of times. Operation (i) and operation (ii) may occur concurrently.

Methods are described herein which include etching silicon nitride from a patterned substrate. The methods include providing a patterned substrate having an exposed silicon nitride portion and an exposed silicon oxide portion. The methods further include exposing the patterned substrate to an alkylsilane precursor. The methods further include forming a self-assembled monolayer on the exposed silicon oxide portion but not on the exposed silicon nitride portion. The methods further include exposing the patterned substrate to a halogen-containing precursor. The methods further include etching the silicon nitride from the exposed silicon nitride portion at a silicon nitride etch rate while removing silicon oxide from the exposed silicon oxide portion at a silicon oxide etch rate less than one percent of the silicon nitride etch rate.

The methods may further include removing the self-assembled monolayer after forming the thickness of patterned layer to reexpose the exposed silicon oxide portion. Forming the self-assembled monolayer may occur before etching the silicon nitride. Exposing the patterned substrate to the alkylsilane precursor may occur concurrently with exposing the patterned substrate to the halogen-containing precursor. Forming the self-assembled monolayer and etching the silicon nitride may both occur while the patterned substrate is in a plasma-free substrate processing region. The halogen-containing precursor may include fluorine. The halogen-containing precursor may include anhydrous HF. The halogen-containing precursor may be a gas-phase precursor. Each molecule of the self-assembled monolayer may include a head moiety and a tail moiety. The head moiety may form a bond with the exposed silicon oxide portion and the tail moiety may extend away from the patterned substrate. The self-assembled monolayer may reduce the subsequent etch rate of the exposed silicon oxide portion relative to the etch rate of the exposed silicon nitride portion.

Methods are described herein which include selectively depositing an additional layer onto a patterned substrate. The methods include providing a patterned substrate having an exposed silicon nitride portion and an exposed silicon oxide portion. The methods further include selectively forming a self-assembled monolayer on the exposed silicon oxide portion but not on the exposed silicon nitride portion. The methods further include exposing the patterned substrate to a deposition precursor. The methods further include depositing additional material onto the exposed silicon nitride portion at least one hundred times faster than onto the silicon oxide portion.

Flowing the deposition precursor into the substrate processing region may occur after selectively forming the self-assembled monolayer. Selectively forming the self-assembled monolayer and depositing additional material onto the exposed silicon nitride portion each may occur while the patterned substrate is in a plasma-free substrate processing region.

To better understand the nature and advantages of the present invention, reference should be made to the following description and the accompanying figures. It is to be understood, however, that each of the figures is provided for the purpose of illustration only and is not intended as a definition of the limits of the scope of the present invention.

DESCRIPTION OF THE DRAWINGS

A further understanding of the nature and advantages of the disclosed technology may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Methods of etching silicon nitride faster than silicon oxide are described. Methods of selectively depositing additional material onto the silicon nitride are also described. Exposed portions of silicon nitride and silicon oxide may both be present on a patterned substrate. A self-assembled monolayer (SAM) is selectively deposited over the silicon oxide but not on the exposed silicon nitride. Molecules of the self-assembled monolayer include a head moiety and a tail moiety, the head moiety forming a bond with the OH group on the exposed silicon oxide portion and the tail moiety extending away from the patterned substrate. A subsequent gas-phase etch using anhydrous vapor-phase HF may then be used to selectively remove silicon nitride much faster than silicon oxide because the SAM has been found to delay the etch and reduce the etch rate. A subsequent deposition may analogously be used to selectively deposit additional material on the silicon nitride much faster than on the silicon oxide due to the presence of the SAM.

Selective remote gas phase etch processes have used aggressive oxidizing precursors in combination with remotely excited fluorine-containing precursor to achieve etch selectivity of silicon nitride relative to silicon. Aggressive oxidizing precursors were used to oxidize a thin layer of the silicon to prevent further etching. The methods presented herein remove the requirement of the oxidation and may or may not remove the remote plasma component which can further enhance the effective etch selectivity. These advantages become increasingly desirable for decreased feature sizes. In embodiments, methods of preferentially forming a self-asssembled monolayer (SAM) on exposed silicon oxide portions but not on exposed silicon nitride portions which are also present on a patterned substrate are described. An etchant is then introduced into a substrate processing region with the substrate to selectively remove silicon nitride.

Figure 1:
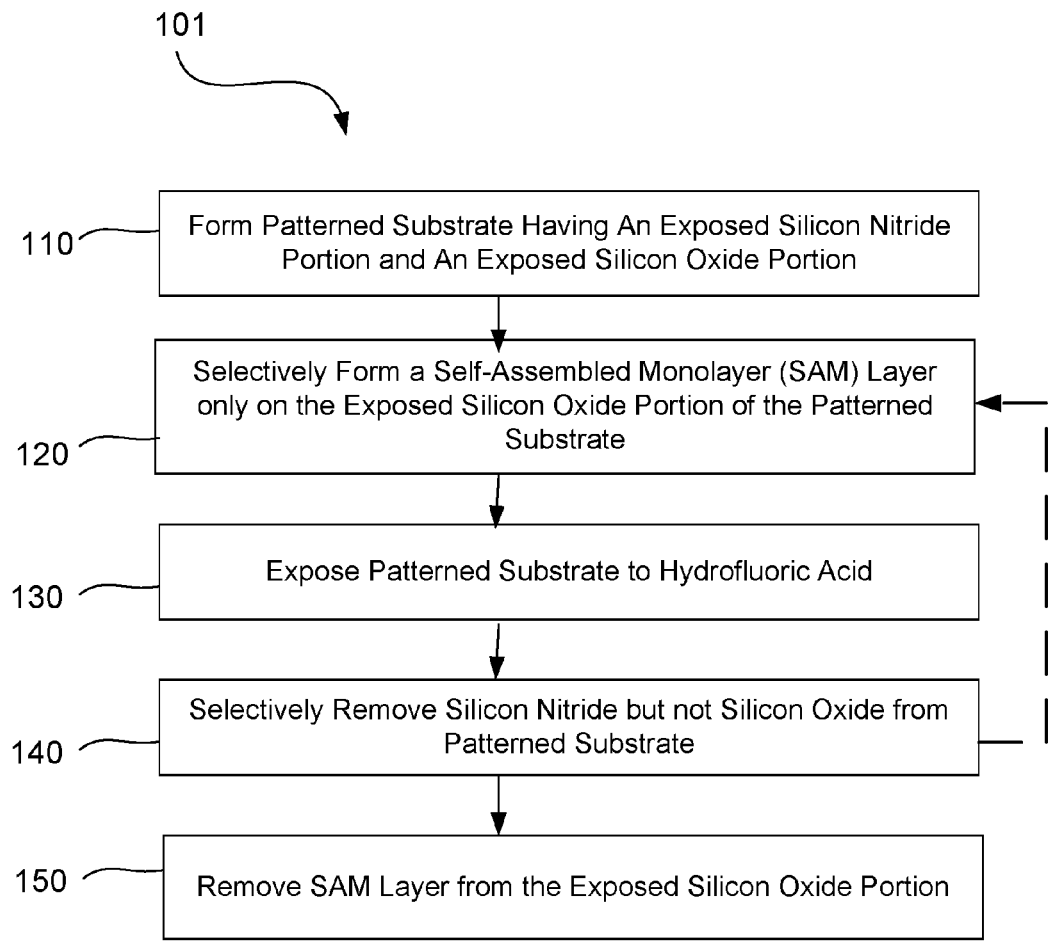
FIG. 1 shows a method of selectively etching silicon nitride according to embodiments.

To better understand and appreciate the embodiments, reference is now made to FIG. 1 which is a flow chart of a silicon nitride selective etch process 101 according to embodiments. Prior to the first operation, a structure is formed in a patterned substrate (operation 110). The structure possesses exposed portions of silicon nitride and silicon oxide. The patterned substrate may then be delivered into a substrate processing region. An alkylsilane may then be flowed into the substrate processing region through a showerhead. A self-assembled monolayer (SAM) is formed selectively over the exposed silicon oxide portion but not over the exposed silicon nitride portion in operation 120.

A flow of anhydrous hydrogen fluoride is initiated into the substrate processing region housing the substrate in operation 130. Gas-phase HF (e.g. anhydrous HF) may be flowed into the substrate processing region through a showerhead to evenly react with the patterned substrate. The showerhead may comprise through-holes which open into the substrate processing region to more evenly distribute the HF (and/or the alkylsilane previously) about the substrate surface. No plasma is ignited in the substrate processing region or upstream from the substrate processing region in embodiments. The substrate processing region may be referred to as a plasma-free substrate processing region during any or all operations described herein. The anhydrous hydrogen fluoride may not passed through any remote plasma before entering the substrate processing region in embodiments. Alternatively, a remote plasma may be used to excite a fluorine-containing precursor/hydrogen-containing precursor combination to form HF or anhydrous HF according to embodiments.

The patterned substrate is selectively etched (operation 140) such that the exposed silicon nitride is selectively removed at a higher rate than the exposed silicon oxide. The exposed silicon oxide portion may be referred to herein as "exposed" silicon oxide despite the thin layer of SAM on its surface. The exposed silicon oxide may comprise or consist of silicon and oxygen according to embodiments. The presence of the SAM over only the silicon oxide may substantially increase the etch selectivity toward exposed silicon nitride relative to the exposed silicon oxide. Process effluents and unreacted reactants are removed from the substrate processing region and then any remaining self-assembled monolayer portion may be removed in operation 150. In some embodiments, the self-assembled monolayer may be removed when the silicon nitride is selectively removed so operation 150 may be optional. The substrate may be removed from the substrate processing region before or after the remaining self-assembled monolayer portion is removed in operation 150 according to embodiments.

All etch processes described herein use a self-assembled monolayer (SAM) selectively deposited onto exposed silicon oxide portions to increase etch selectivity of exposed silicon nitride portions. The etching of the exposed silicon nitride portions is an aggressive etch which can degrade the integrity of the self-assembled monolayer over the exposed silicon oxide portions. The SAM is gradually degraded and removed over time. All processes described herein may exhibit satisfactory silicon nitride etch selectivity for many semiconductor processes for which the etch lasts 0.5 minutes to 4 minutes or between 1 minute and 3 minutes in embodiments. Alternatively, the SAM can be reapplied prior to repeating the etch process as indicated with the dashed line in FIG. 1. In embodiments, operations 120-140 may be repeated an integral number of times to remove more material while maintaining even higher silicon nitride selectivity relative to a single pass through method 101. Operations 120-150 may be repeated an integral number of times, in embodiments which benefit from cleaning up the residual SAM before reapplying a new self-assembled monolayer over the exposed silicon oxide portion. The silicon oxide portion may be treated to reterminate the surface with OH groups e.g. by exposure to potassium hydroxide.

Generally speaking, a fluorine-containing precursor (or plasma effluents formed in a remote plasma from plasma effluents formed from a fluorine-containing precursor) may be flowed into the substrate processing region to etch the substrate. The fluorine-containing precursor may include one or more of $F_2$, $NF_3$ or $FCl_3$ according to embodiments. The fluorine-containing precursor may be devoid of hydrogen in embodiments, however, the fluorine-containing precursor may be HF. The plasma effluents may be formed from a combination of a fluorine-containing precursor and a hydrogen-containing precursor in embodiments. The plasma effluents may comprise or consist of HF or anhydrous HF according to embodiments. The use of the remote plasma to form the plasma effluents comprising HF may be an in-situ method for generating HF or anhydrous HF. The hydrogen-containing precursor may comprise one or more of $H_2$ or $H_2O$ in embodiments. The fluorine-containing precursor may comprise or consist of HF according to embodiments. The fluorine-containing precursor may be formed by bubbling a carrier gas through a liquid hydrogen-fluorine solution in embodiments. The liquid hydrogen-fluorine solution may be a 49% HF solution or a 70% HF-pyridine solution according to embodiments.

In embodiments, HF may be flowed into the substrate processing region after the alkylsilane is flowed into the substrate processing region. However, the HF may be flowed into the substrate processing region concurrently with the flowing of the alkylsilane precursor into the substrate processing region, according to embodiments. Concurrent exposure may regenerate the SAM layer on the exposed silicon oxide as the etch process 101 is proceeding which may provide the benefit of decreasing processing time. In embodiments, selectively etching the patterned substrate may occur at the same time as, or after, the forming of the self-assembled monolayer. The self-assembled monolayer may be formed initially before beginning the concurrent regeneration of the self-assembled monolayer with the selective etching of the patterned substrate according to embodiments. Initial formation of the self-assembled monolayer on the exposed silicon oxide portion ensures the exposed silicon oxide portion is protected (at least temporarily) from the aggressive etchant (e.g. HF) in embodiments. Generally speaking, forming the self-assembled monolayer and selectively etching the patterned substrate may be performed in separate substrate processing chambers and therefore in separate substrate processing regions according to embodiments.

Silicon nitride selective etch process 101 may also be used to remove silicon nitride faster than silicon. Rather than oxidizing the exposed silicon to prevent etching, the etchants described herein have been found to produce reactants which predominantly etch the silicon nitride and leave silicon essentially alone. As a consequence, essentially no silicon is consumed to produce a protective silicon oxide layer to achieve the high etch selectivities. As such, exposed silicon portions may also be present on the patterned substrate and may comprise or consist of silicon in embodiments. The selectivity of etch process 101 (exposed silicon nitride:exposed silicon oxide or exposed silicon) may be greater than 100:1, greater than 120:1 or greater than 140:1 in embodiments.

The etch processes introduced herein have been found to provide silicon nitride etch selectivity not only to high density silicon oxide films but also to low density silicon oxide films. The silicon nitride selectivities achieved enable gas phase etches to be used in a broader range of process sequences. Exemplary deposition techniques which result in low density silicon oxide include chemical vapor deposition using dichlorosilane as a deposition precursor, spin-on glass (SOG) or plasma-enhanced chemical vapor deposition. High density silicon oxide may be deposited as thermal oxide (exposing silicon to, e.g., $O_2$ at high temperature), disilane precursor furnace oxidation or high-density plasma chemical vapor deposition according to embodiments. The selectivity of etch process 101 (exposed silicon nitride:exposed high quality silicon oxide) may be greater than 100:1, greater than 120:1 or greater than 140:1 in embodiments. The selectivity of etch process 101 (exposed silicon nitride: exposed low quality silicon oxide) may be greater than 100:1, greater than 120:1 or greater than 140:1 according to embodiments.

The anhydrous hydrogen fluoride may further include one or more relatively inert gases (e.g. He, $N_2$, Ar). Flow rates and ratios of the different gases may be used to control etch rates and etch selectivity. In an embodiment, the anhydrous hydrogen fluoride may be flowed into the substrate processing region at a flow rate of between about 10 sccm (standard cubic centimeters per minute) and 1,000 sccm in embodiments. Argon (Ar) and/or Helium (He) may be flowed along with either (or both, separately) precursor at a flow rate of between 0 sccm and 3,000 sccm. One of ordinary skill in the art would recognize that other gases and/or flows may be used depending on a number of factors including processing chamber configuration, substrate size, geometry and layout of features being etched. These process parameters apply to all examples described herein. Additional process parameters will be given during and following the example of FIG. 2.

Figure 2:
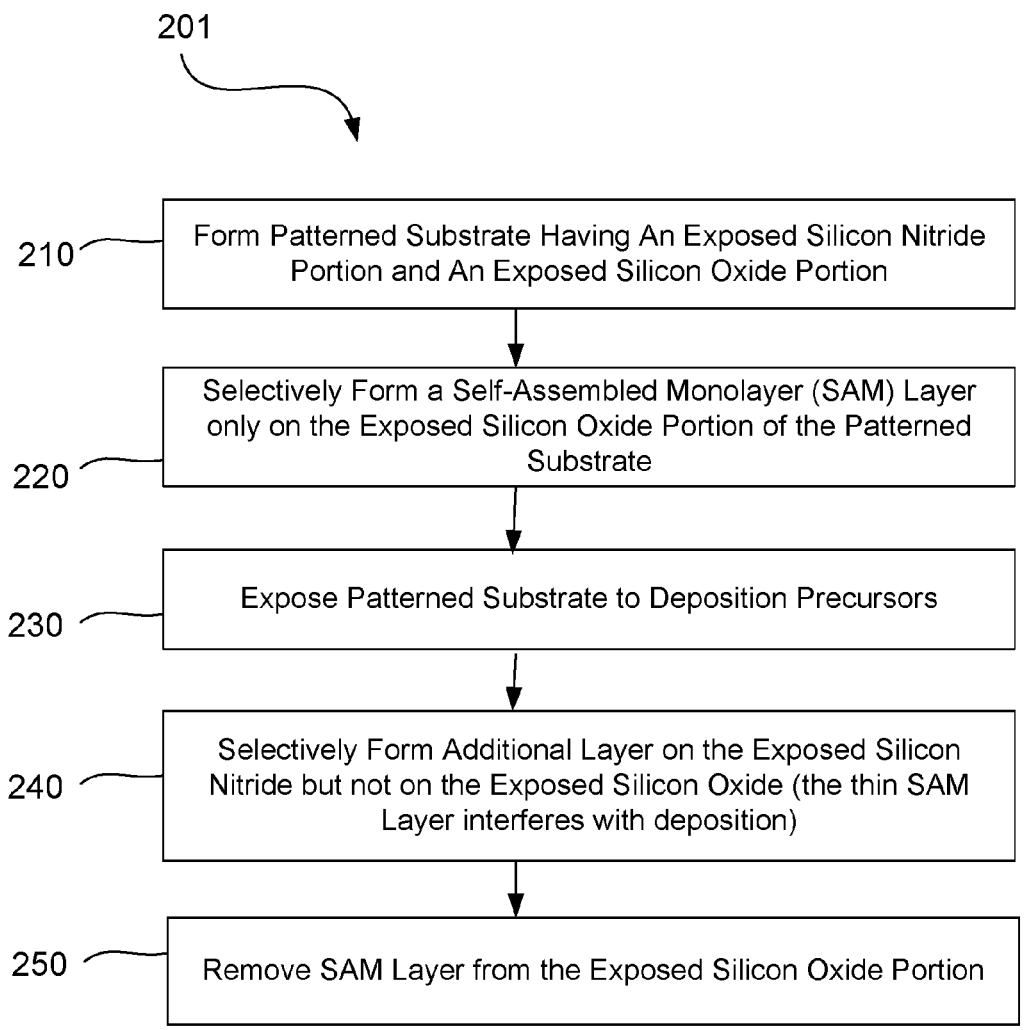
FIG. 2 shows a method of selectively forming a film on silicon nitride according to embodiments.

Reference is now made to FIG. 2 which is a flow chart of a method of selectively forming a film on silicon nitride according to embodiments. Prior to the first operation, a structure is formed in a patterned substrate (operation 210). The structure possesses exposed portions of silicon nitride and silicon oxide. The patterned substrate may then be delivered into a substrate processing region.

An alkylsilane may be flowed into the substrate processing region through a showerhead. A self-assembled monolayer is selectively formed upon the exposed silicon oxide portion but not on the exposed silicon nitride portion (operation 220). A deposition precursor is flowed into the substrate processing region through the showerhead in operation 230. The showerhead may comprise through-holes which open into the substrate processing region to more evenly distribute either precursor about the substrate surface.

An additional layer is selectively deposited (operation 240) such that the additional layer is deposited on the silicon nitride at a higher deposition rate than any deposition rate on the exposed silicon oxide. The deposition rate of the additional layer onto the exposed silicon nitride may be less than the deposition rate onto the exposed silicon oxide as a result of the presence of the SAM layer. The additional layer is patterned already (during and immediately after deposition in embodiments) and may involve no patterning or etching to become patterned. The substrate processing region may be plasma-free during all operations of selective film formation process 201 or during operations 220-240 in embodiments. The exposed silicon oxide portion may comprise or consist of silicon and oxygen according to embodiments. The presence of the SAM on the exposed silicon oxide portion may substantially inhibit or eliminate the deposition rate of the additional layer onto the exposed silicon oxide but allow deposition to proceed onto the exposed silicon nitride. As before, the exposed silicon oxide will be described herein as "exposed" whether or not the thin SAM layer is adsorbed. Process effluents and/or unreacted reactants may be removed from the substrate processing region and then the substrate may be removed from the processing region.

As in the previous example, the SAM layer may optionally be removed (operation 250) to remove the SAM layer from the exposed silicon oxide portion. Selective deposition method 201 deposits additional material of the additional layer only onto the exposed silicon nitride portions without lithographic patterning according to embodiments. Lithographic patterning may include depositing photoresist, performing photolithography and etching the exposed silicon nitride portions and none of the three may be performed and the additional layer would still be patterned as described herein. In embodiments, no lithography is performed after operation 210, up to and including operation 250. Stated another way the additional layer may be patterned after formation without applying any intervening lithography operations. The deposited thickness of the additional layer on the exposed silicon nitride portion may be greater than 5 nm, greater than 10 nm, greater than 20 nm or greater than 30 nm in embodiments. Meanwhile the deposited thickness of the additional layer on the exposed silicon oxide portion may be immeasurably small by the most sensitive means. The deposited thickness of the additional layer may be less than 0.3 nm, less than 0.2 nm or less than 0.1 nm according to embodiments.

The etching and deposition processes described herein may be applied to patterned substrates having high aspect ratio features in the form of trenches or vias. The etch rate or deposition rate near the bottom of a high aspect ratio feature may be within 12%, within 7%, within 5% or within 3% of the etch rate or deposition rate near the opening of the high aspect ratio feature in embodiments. The depth of a via or trench (high aspect ratio features) may be greater than 0.5 µm, greater than 1.0 µm or greater than 2.0 µm according to embodiments. The width of a via or trench (in the narrower dimension) may be less than 30 nm, less than 20 nm or less than 10 nm in embodiments. The depth-to-width aspect ratio may be greater than ten, greater than fifty or greater than one hundred according to embodiments.

The etch rate of exposed silicon nitride portion or the deposition rate onto the exposed silicon nitride portion may be unaffected by the SAM because the SAM selectively deposits only on the exposed silicon oxide portion and not on the exposed silicon nitride portion or any exposed silicon portion. The etch rate of the exposed silicon nitride portion may be more than one hundred times, more than one hundred fifty times or more than two hundred times the etch rate of the exposed silicon oxide portion. Analogously, the deposition rate of additional material of the additional layer onto the exposed silicon nitride portion may be more than one hundred times, more than one hundred fifty times or more than two hundred times the deposition rate onto the exposed silicon oxide portion.

The SAM may be deposited on the substrate by exposing the exposed silicon oxide of the patterned substrate to an alkylsilane either in the same substrate processing region used for the etch (as in the examples) or in a different substrate processing region in embodiments. Generally speaking, a SAM precursor may be used to deposit the SAM and the SAM precursor may comprise or consist of silicon, oxygen, carbon and hydrogen according to embodiments. The SAM precursor may comprise or consist of silicon, oxygen, carbon, chlorine and hydrogen in embodiments. The SAM precursor may comprise or consist of silicon, oxygen, carbon, nitrogen and hydrogen according to embodiments. The SAM precursor may comprise or consist of any of the three aforementioned groups of elements and fluorine in embodiments.

The SAM precursor may comprise or consist of a head moiety and a tail moiety. The head moiety may have a silicon covalently bonded to three methoxyl groups and the tail moiety may be an alkyl chain covalently bonded to the remaining bond of the silicon atom of the head moiety in embodiments. The silicon atom of the head moiety may lose a methoxyl group and the silicon atom may then bond to the exposed silicon oxide portion provided the chemical termination has been correctly formed. Hydroxyl groups on the surface are thought to promote the chemical reaction between the SAM precursor and the exposed silicon oxide portion. The alkylsilane may further comprise a halogen. The alkylsilane may be one of C8-methoxysilane, C7-methoxysilane, C6-methoxysilane, C5-methoxysilane, C4-methoxysilane, C3-methoxysilane, C5-chlorosilane, C4-chlorosilane or C3-chlorosilane according to embodiments. The tail moiety may function to prevent or discourage etching of or deposition onto silicon oxide. The tail moiety of the SAM molecule (the alkylsilane) may include an alkyl group having more than 2 carbon atoms, more than 3 carbon atoms, more than 4 carbon atoms, more than 5 carbon atoms, or more than 6 carbon atoms, more than 8 carbon atoms, more than 12 carbon atoms, more than 14 carbon atoms, or more than 16 carbon atoms, covalently bonded in a chain in embodiments. Depending in part on the length of the tail moiety, the SAM precursor may be in gas, liquid or solid form which may be provided to the patterned substrate with a variety of appropriate techniques. Liquids and solids may be vaporized and carried into a chemical vapor deposition chamber using a relatively inert carrier gas in embodiments. Exemplary hardware used for depositing self-assembled monolayers using a liquid precursor will be described shortly.

The SAM precursors used to deposit the self-assembled monolayers herein may be described as SAM molecules especially when tail moieties (TM) and head moieties (HM) and minute interactions between the precursors and the patterned substrate are being described. Generally speaking, the tail moiety may be a linear or branched alkyl chain or may be a cyclic hydrocarbon in embodiments. The tail moiety may comprise or consist of carbon and hydrogen according to embodiments. Regardless of shape, the tail moiety may be a fluorinated hydrocarbon and may comprise or consist of carbon, hydrogen and fluorine in embodiments. The head moiety may be a methoxysilane (e.g. a dimethoxysilane or a trimethoxysilane), an ethoxysilane (e.g. a diethoxysilane or a triethoxysilane), an amine silane, an amino silane, a silazane or a chlorosilane. The SAM precursor may have a tail which is a fluorinated alkylsilane in embodiments. The SAM molecules may be one or more of n-propyltrimethoxysilane, n-octyltrimethoxysilane, or trimethoxy(octadecyl)silane according to embodiments. The SAM precursor may have a tail which is a phenyl group and may be a phenyl alkylsilane in embodiments.

Exposed silicon (if present) and exposed silicon nitride are not chemically modified by the same chemical preparation which affects the silicon oxide and therefore may not develop hydroxyl termination and may not subsequently react with the SAM precursor in embodiments. The SAM is formed from the SAM precursor by the chemisorption of the head moiety onto a substrate from either the vapor or liquid phase followed by a general alignment of tail moiety distal from silicon oxide bonding sites. The tail moiety may not chemically bond to any of silicon, silicon oxide or silicon nitride according to embodiments. Once all silicon oxide bonding sites on exposed silicon oxide portion are occupied with SAM molecules, the bonding process may cease, becoming a self-limiting process.

During the operation of selectively etching the exposed silicon nitride or selectively depositing additional material onto the exposed silicon nitride, the pressure in the substrate processing region may be greater than 0.5 Torr, greater than 5 Torr, greater than 10 Torr, greater than 15 Torr or greater than 25 Torr according to embodiments. The pressure in the substrate processing region may be less than 1,000 Torr, less than 750 Torr, less than 500 Torr, less than 250 Torr, or less than 100 Torr in embodiments. Upper bounds of all parameters may be combined with lower bounds of the same parameters to form additional embodiments. The pressure in the substrate processing region during selective etching and selective deposition operations described herein may be between 0.5 Torr and 1,000 Torr according to embodiments. In a preferred embodiment, the pressure in the substrate processing region during the operations of selectively etching or selectively depositing is between 20 Torr and 110 Torr.

During the operation of selectively etching, the temperature of the patterned substrate may be between −20° C. and 300° C. or between 0° C. and 250° C. in embodiments. During the operation of selectively depositing additional material, the temperature of the patterned substrate may be between −20° C. and 500° C. or between 0° C. and 450° C. according to embodiments. During the operation of selectively etching exposed silicon nitride or selectively depositing additional material onto the exposed silicon nitride, the temperature of the patterned substrate may be between 40° C. and 200° C. or between 50° C. and 150° C. in preferred embodiments. Conventional processes involving anhydrous hydrogen fluoride have etched silicon oxide faster than silicon nitride by keeping the substrate temperature lower than the ranges provided as preferred embodiments. The etch selectivity of silicon nitride relative to silicon oxide may be in the highest range for patterned substrate temperatures between 55° C. and 75° C. The patterned substrate temperature may be between 55° C. and 75° C. in embodiments. The temperature of the patterned substrate may be in all these ranges during operations 240, 220, 140 and/or 120 according to embodiments.

The self-assembled monolayers may be thermally stable and can withstand thermal processing at relatively high temperatures up to 400° C., up to 450° C. or even up to 500° C. A temperature of the patterned substrate is less than 400° C., less than 450° C. or less than 500° C. during each of the operation of forming the self-assembled monolayer and etching the exposed silicon nitride portion according to embodiments. Analogously, a temperature of the patterned substrate is less than 400° C., less than 450° C. or less than 500° C. during each of the operation of forming the self-assembled monolayer and selectively depositing additional material onto the exposed silicon nitride portion according to embodiments.

In all etch processes described herein the substrate processing region may be devoid of nitrogen, during the operation of selectively etching exposed silicon nitride. For example, the substrate processing region may be devoid of ammonia (or NxHy in general) during the silicon nitride etch. A source of ammonia is often added to conventional processes involving anhydrous hydrogen fluoride to enhance the etch rate of silicon oxide, which is undesirable in embodiments described herein. Such a reaction reduces the selectivity of the exposed silicon nitride portions as compared with exposed silicon oxide portions.

The substrate processing region may be referred to "plasma-free" during the selective deposition process and during all deposition and etch processes described herein. Maintaining a plasma-free substrate processing region and employing the precursors described herein enable the achievement of high etch rate selectivity of silicon nitride relative to silicon and silicon oxide. Analogously, maintaining a plasma-free substrate processing region enhances the deposition rate differential between the exposed surfaces. Using an alternative definition, the electron temperature may be less than 0.5 eV, less than 0.45 eV, less than 0.4 eV, or less than 0.35 eV within the substrate processing region during any or all operations described herein according to embodiments. A benefit of the processes described herein include a reduction in plasma damage by using predominantly neutral species to perform the selective silicon nitride etch and deposition processes. Conventional local plasma processes may include sputtering and bombardment components. Another benefit of the processes described herein include a reduction in stress on delicate features on a patterned substrate compared to conventional wet etch processes which can cause bending and peeling of small features as a result of the surface tension of liquid etchants.

In embodiments, the SAM precursors may deposit on both two or more chemically distinct portions of the patterned layer but may form covalent bonds on only one of the two portions. On the other portion the precursors may bond by physisorption meaning no covalent bonds are formed between the precursors and the second exposed surface portion. In this scenario, the physisorbed precursors may be removed easily while allowing the chemisorbed (covalently bonded) precursors to stay. This is an alternative method for producing a selectively-deposited SAM layer for all processes described herein.

Figure 3A:
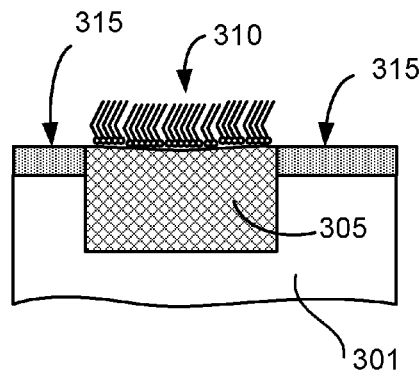
FIGS. 3A and 3B are side views of a patterned substrate during and following selective etching according to embodiments.
Figure 3B:
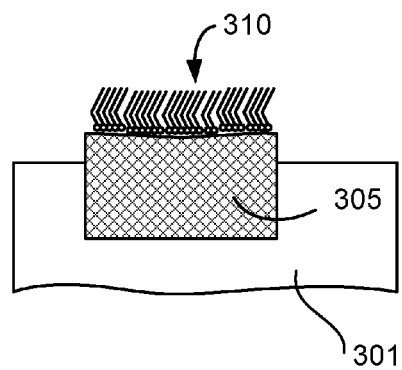
Figure 3C:
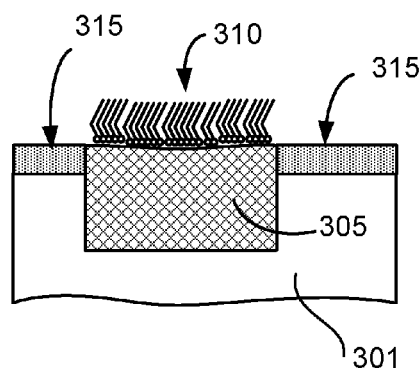
FIGS. 3C and 3D are side views of a patterned substrate during and following selective deposition according to embodiments.
Figure 3D:
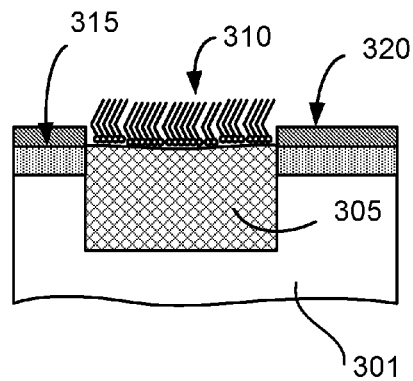

FIGS. 3A and 3B are side views of a patterned substrate during and following a selective etching according to embodiments. FIGS. 3C and 3D are side views of a patterned substrate during and following a selective deposition according to embodiments. In both FIGS. 3A and 3C, a self-assembled monolayer 310 is grown is selectively deposited on exposed silicon oxide portion 305 of patterned substrate 301 but self-assembled monolayer 310 is not deposited on exposed silicon nitride portion 315. FIG. 3B indicates that the etchant (e.g. anhydrous HF) removes the exposed silicon nitride portion 315 but leaves exposed silicon oxide 305 on patterned substrate 301. Analogously, FIG. 3D indicates that deposition precursors add material (an additional layer 320) onto the exposed silicon nitride portion 315 but does not add material onto exposed silicon oxide 305 of patterned substrate 301. In embodiments, the additional deposition may proceed only on regions without a SAM coating. For both selective etching and selective deposition, the methods described herein may provide cost savings and increased overlay accuracy compared to traditional methods which would have relied on lithographic patterning. Following the SAM selective deposition, the subsequent deposition of additional layer 320 may also be referred to as a selective deposition but is the reverse image of the selectively deposited SAM layer. The subsequently deposited film may have a greater utility (compared to SAM) in the functioning of the completed integrated circuit or in further processing.

Figure 4A:
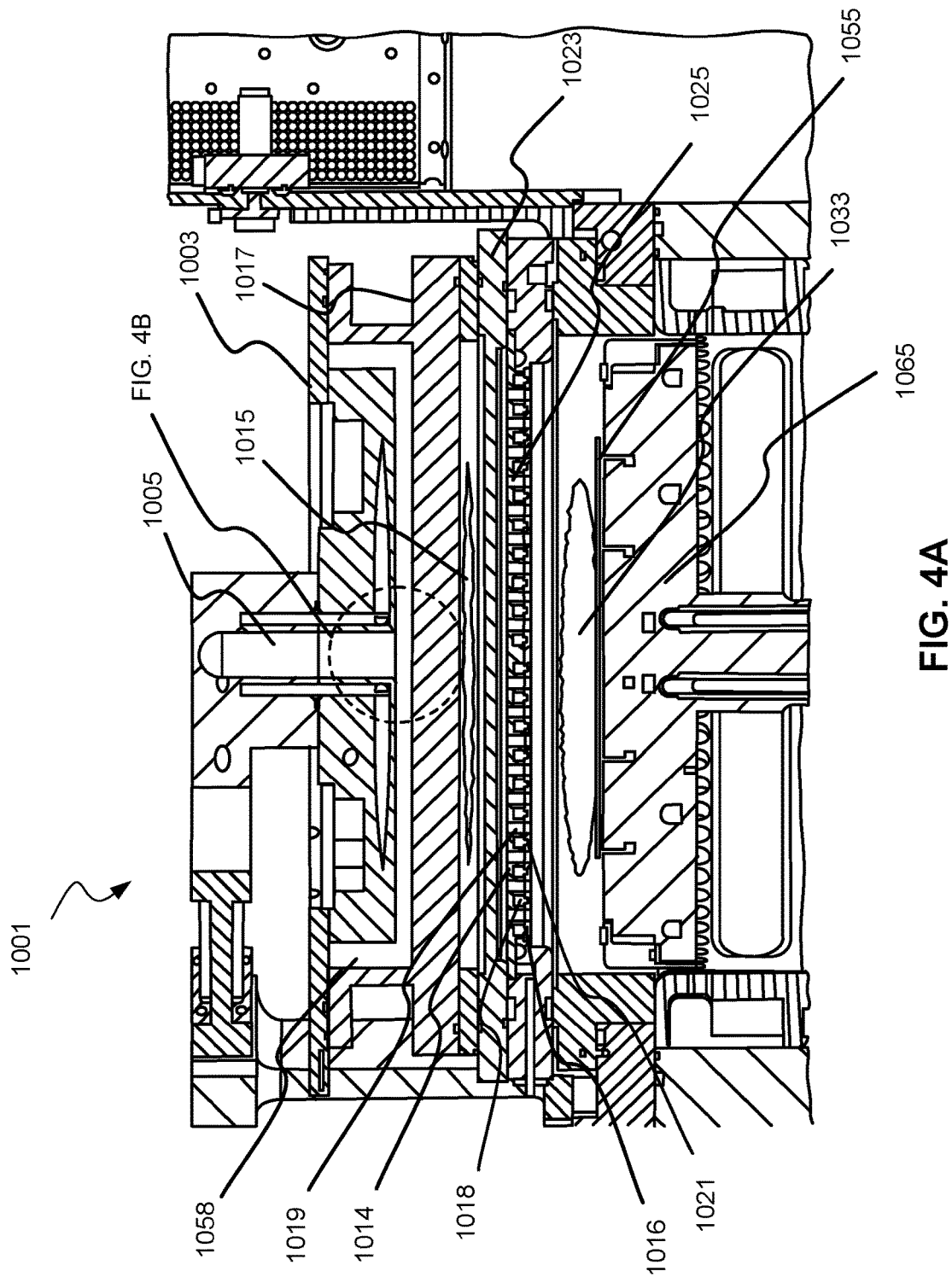
FIG. 4A shows a schematic cross-sectional view of a substrate processing chamber according to embodiments.

Exemplary hardware will now be described. FIG. 4A shows a cross-sectional view of an exemplary substrate processing chamber 1001 with a partitioned region within the processing chamber. During film etching, a process gas may be flowed through gas inlet assembly 1005 and into remote region 1015. A cooling plate 1003, faceplate 1017, ion suppressor 1023, showerhead 1025, and a substrate support 1065 (also known as a pedestal), having a substrate 1055 disposed thereon, are shown and may each be included according to embodiments. Pedestal 1065 may have a heat exchange channel through which a heat exchange fluid flows to control the temperature of the substrate. This configuration may allow the substrate 1055 temperature to be cooled or heated to maintain relatively low temperatures, such as between −40° C. to 500° C. Pedestal 1065 may also be resistively heated to relatively high temperatures, such as between 100° C. and 1100° C., using an embedded heater element.

Exemplary configurations may include having the gas inlet assembly 1005 open into a gas supply region 1058 partitioned from the remote region 1015 by faceplate 1017 so that the gases/species flow through the holes in the faceplate 1017 into the remote region 1015. A precursor, for example anhydrous HF, may be flowed into substrate processing region 1033 by embodiments of the showerhead described herein. Excited species derived from the process gas in remote region 1015 may comprise HF and travel through apertures in showerhead 1025 and optionally combine with a secondary precursor flowing into substrate processing region 1033 from a separate portion of the showerhead, which may therefore be called a dual-channel showerhead. An optional second precursor such as silane or water vapor may further increase the etch rate of silicon nitride or reduce the etch rate of silicon or silicon oxide, when combined with HF in this manner.

Figure 4B:
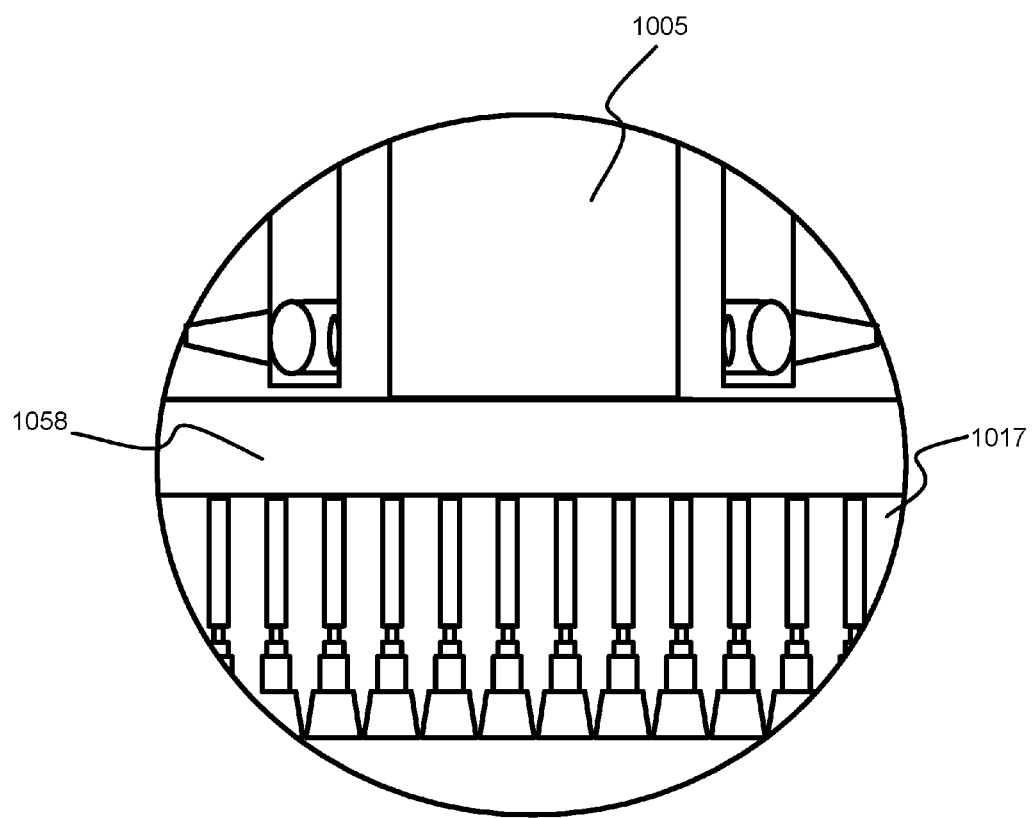
FIG. 4B shows a schematic cross-sectional view of a portion of a substrate processing chamber according to embodiments.

FIG. 4B shows a detailed view of the features affecting the processing gas distribution through faceplate 1017. The gas distribution assemblies such as showerhead 1025 for use in the processing chamber section 1001 may be referred to as dual-channel showerheads (DCSH) and are additionally detailed in the embodiments described in FIG. 4A as well as FIG. 4C herein. The dual channel showerhead may provide for etching processes that allow for separation of etchants outside of the substrate processing region 1033 to provide limited interaction with chamber components and each other prior to being delivered into substrate processing region 1033.

The showerhead 1025 may comprise an upper plate 1014 and a lower plate 1016. The plates may be coupled with one another to define a volume 1018 between the plates. The coupling of the plates may be so as to provide first fluid channels 1019 through the upper and lower plates, and second fluid channels 1021 through the lower plate 1016. The formed channels may be configured to provide fluid access from the volume 1018 through the lower plate 1016 via second fluid channels 1021 alone, and the first fluid channels 1019 may be fluidly isolated from the volume 1018 between the plates and the second fluid channels 1021. The volume 1018 may be fluidly accessible through a side of the gas distribution assembly 1025. Although the exemplary system of FIGS. 4A-4C includes a dual-channel showerhead, it is understood that alternative distribution assemblies may be utilized that maintain first and second precursors fluidly isolated prior to substrate processing region 1033. For example, a perforated plate and tubes underneath the plate may be utilized, although other configurations may operate with reduced efficiency or not provide as uniform processing as the dual-channel showerhead described.

A process gas may flow into remote region 1015 and then through first fluid channels 1019 of showerhead 1025. The process gas may include HF for etching or an alkylsilane for deposition. A plasma may not be generated and may not be present in substrate processing region 1033 during any or all operations presented herein. A plasma may not be generated and may not be present in remote region 1015 during any or all operations presented herein. The two regions may be referred to as plasma-free substrate processing region 1033 and plasma-free remote region 1015 in embodiments. The process gas may also include a carrier gas such as helium, argon, nitrogen ($N_2$), etc especially when a liquid precursor source is used. The showerhead may be referred to as a dual-channel showerhead as a result of the two distinct pathways into the substrate processing region. The hydrogen fluoride may be flowed through the through-holes in the showerhead and the secondary precursor may pass through separate channels in the dual-channel showerhead. The separate channels may open into the substrate processing region but not into the remote region as described above. Combined flow rates of precursors into the substrate processing region may account for 0.05% to about 20% by volume of the overall gas mixture; the remainder being carrier gases.

Figure 4C:
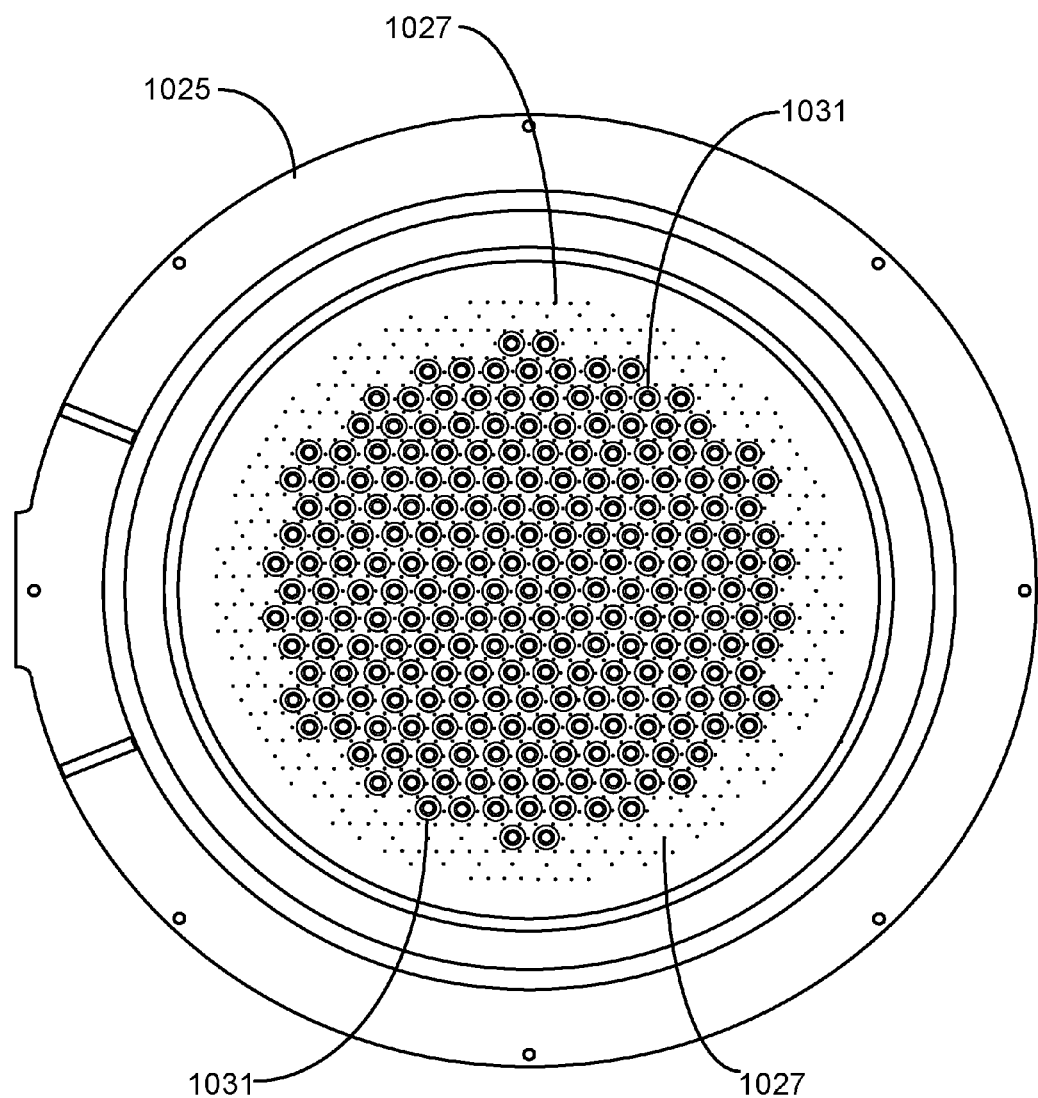
FIG. 4C shows a bottom view of a showerhead according to embodiments.

FIG. 4C is a bottom view of a showerhead 1025 for use with a processing chamber in embodiments. Showerhead 1025 corresponds with the showerhead shown in FIG. 4A. Through-holes 1031, which show a view of first fluid channels 1019, may have a plurality of shapes and configurations to control and affect the flow of precursors through the showerhead 1025. Small holes 1027, which show a view of second fluid channels 1021, may be distributed substantially evenly over the surface of the showerhead, even amongst the through-holes 1031, which may help to provide more even mixing of the precursors as they exit the showerhead than other configurations.

Figure 5A:
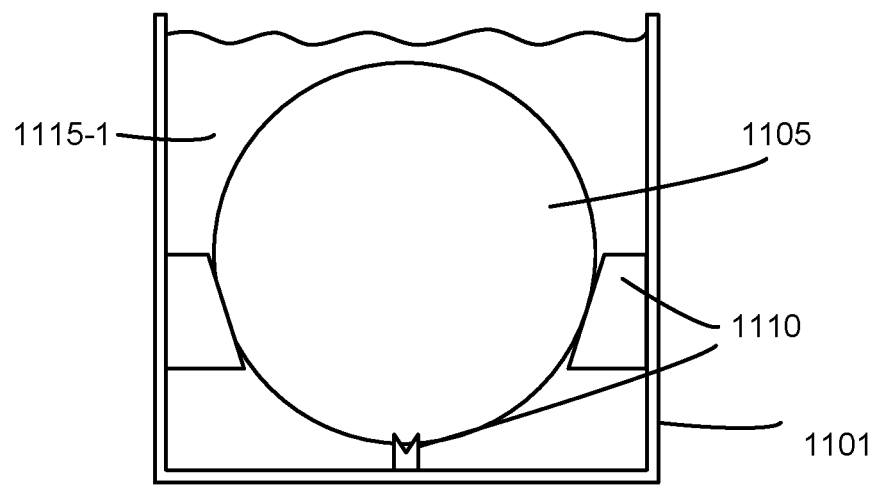
FIGS. 5A and 5B are schematic views of substrate processing equipment according to embodiments.
Figure 5B:
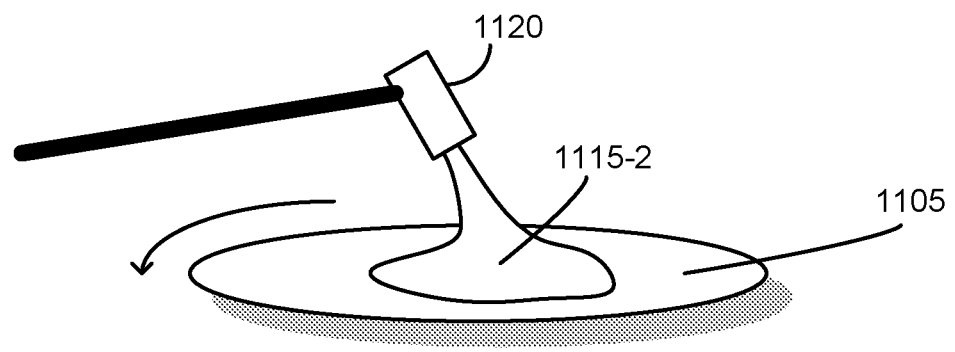

FIGS. 5A and 5B are schematic views of substrate processing equipment according to embodiments. FIG. 5A shows hardware used to expose substrate 1105 to a liquid SAM precursor solution 1115-1 in a tank 1101. Substrate 1105 may be lowered into solution 1115-1 using a robot and may be supported by substrate supports 1110 during processing. FIG. 5B shows alternative hardware which spins substrate 1105 while pouring liquid SAM precursor solution 1115-2 from a dispenser 1120 across the top surface of the substrate.

Figure 6:
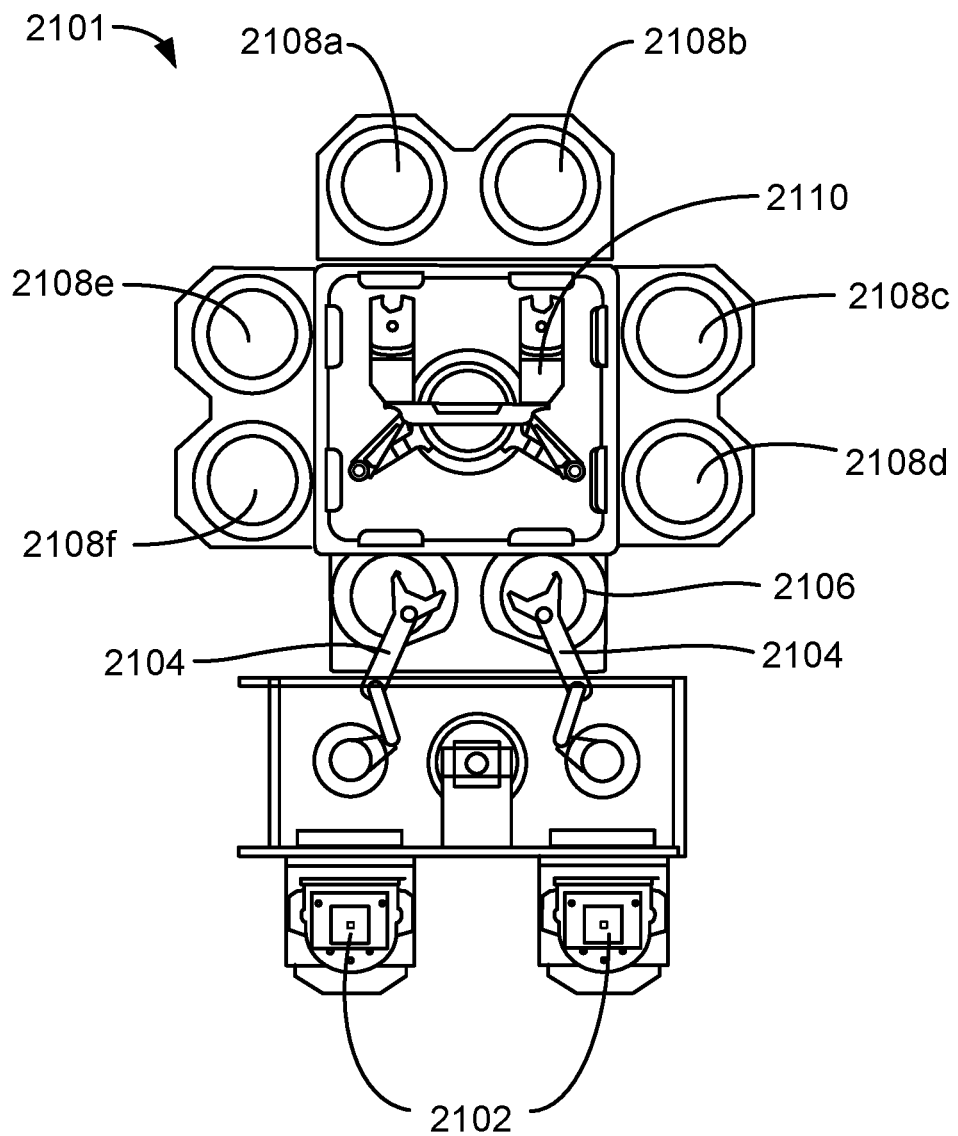
FIG. 6 shows a top view of an exemplary substrate processing system according to embodiments.

Embodiments of the systems described herein may be incorporated into larger fabrication systems for producing integrated circuit chips. FIG. 6 shows one such processing system (mainframe) 2101 of deposition, etching, baking, and curing chambers in embodiments. In the figure, a pair of front opening unified pods (load lock chambers 2102) supply substrates of a variety of sizes that are received by robotic arms 2104 and placed into a low pressure holding area 2106 before being placed into one of the substrate processing chambers 2108a-f. A second robotic arm 2110 may be used to transport the substrate wafers from the holding area 2106 to the substrate processing chambers 2108a-f and back. Each substrate processing chamber 2108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The term "gap" is used throughout with no implication that the etched geometry has a large horizontal aspect ratio. Viewed from above the surface, gaps may appear circular, oval, polygonal, rectangular, or a variety of other shapes. A "trench" is a long gap. A trench may be in the shape of a moat around an island of material whose aspect ratio is the length or circumference of the moat divided by the width of the moat. The term "via" is used to refer to a low aspect ratio trench (as viewed from above) which may or may not be filled with metal to form a vertical electrical connection. As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon oxide" of the patterned substrate is predominantly $SiO_2$ but may include concentrations of other elemental constituents such as, e.g., nitrogen, hydrogen and carbon. In some embodiments, silicon oxide portions described herein consist of or consist essentially of silicon and oxygen. Exposed "silicon nitride" or "SiN" of the patterned substrate is predominantly $Si_3N_4$ but may include concentrations of other elemental constituents such as, e.g., oxygen, hydrogen and carbon. In some embodiments, silicon nitride portions described herein consist of or consist essentially of silicon and nitrogen.

The term "precursor" is used to refer to any process gas which takes part in a reaction to either remove material from or deposit material onto a surface. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the present embodiments. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the claims, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of removing silicon nitride from a patterned substrate, the method comprising:
   (i) selectively forming a self-assembled monolayer over silicon oxide portions of the patterned substrate but not over silicon nitride portions of the patterned substrate, wherein the self-assembled monolayer is patterned after formation without applying any form of lithography; and
   (ii) selectively etching the silicon nitride from the silicon nitride portions faster than silicon oxide from the silicon oxide portions;
   wherein operation (i) and operation (ii) occur concurrently and wherein operations (i) and (ii) are repeated an integral number of times.

2. The method of claim 1 wherein selectively etching the silicon nitride occurs without an application of lithography.

3. A method of etching silicon nitride from a patterned substrate, the method comprising:
   providing a patterned substrate having an exposed silicon nitride portion and an exposed silicon oxide portion;
   exposing the patterned substrate to an alkylsilane precursor, wherein the alkylsilane is one of C8-methoxysilane, C7-methoxysilane, C6-methoxysilane, C5-methoxysilane, C4-methoxysilane, C3-methoxysilane, C5-chlorosilane, C4-chlorosilane or C3-chlorosilane;

forming a self-assembled monolayer on the exposed silicon oxide portion but not on the exposed silicon nitride portion;

exposing the patterned substrate to a halogen-containing precursor;

etching the silicon nitride from the exposed silicon nitride portion at a silicon nitride etch rate while removing silicon oxide from the exposed silicon oxide portion at a silicon oxide etch rate less than one percent of the silicon nitride etch rate.

4. The method of claim 3 further comprising removing the self-assembled monolayer after etching the silicon nitride.

5. The method of claim 3 wherein forming the self-assembled monolayer occurs before etching the silicon nitride.

6. The method of claim 3 wherein exposing the patterned substrate to the alkylsilane precursor occurs concurrently with exposing the patterned substrate to the halogen-containing precursor.

7. The method of claim 3 wherein forming the self-assembled monolayer and etching the silicon nitride both occur while the patterned substrate is in a plasma-free substrate processing region.

8. The method of claim 3 wherein the halogen-containing precursor comprises fluorine.

9. The method of claim 3 wherein the halogen-containing precursor comprises anhydrous HF.

10. The method of claim 3 wherein the halogen-containing precursor is a gas-phase precursor.

11. The method of claim 3 wherein each molecule of the self-assembled monolayer includes a head moiety and a tail moiety, the head moiety forming a covalent bond with the exposed silicon oxide portion and the tail moiety extending away from the patterned substrate.

12. A method of selectively depositing an additional layer onto a patterned substrate, the method comprising:

providing a patterned substrate having an exposed silicon nitride portion and an exposed silicon oxide portion;

selectively forming a self-assembled monolayer on the exposed silicon oxide portion but not on the exposed silicon nitride portion, wherein each molecule of the self-assembled monolayer includes a head moiety and a tail moiety, the head moiety forming a covalent bond with the exposed silicon oxide portion and the tail moiety extending away from the patterned substrate;

exposing the patterned substrate to a deposition precursor;

depositing additional material onto the exposed silicon nitride portion at least one hundred times faster than onto the exposed silicon oxide portion.

13. The method of claim 12 wherein depositing the additional material occurs after selectively forming the self-assembled monolayer.

14. The method of claim 12 wherein selectively forming the self-assembled monolayer and depositing additional material onto the exposed silicon nitride portion each occur while the patterned substrate is in a plasma-free substrate processing region.

* * * * *